(12) United States Patent
Jang et al.

(10) Patent No.: US 9,333,700 B2
(45) Date of Patent: May 10, 2016

(54) IMPRINTING APPARATUS AND IMPRINTING METHOD USING THE SAME

(71) Applicant: LG DISPLAY CO., LTD., Seoul (KR)

(72) Inventors: Doo Hee Jang, Suwon-si (KR); Tae Joon Song, Paju-si (KR); Dhang Kwon, Daejeon (KR); Hang Sup Cho, Paju-si (KR); Seong Pil Cho, Paju-si (KR); Ho Su Kim, Paju-si (KR); Jin Hee Jang, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 18 days.

(21) Appl. No.: 14/218,468

(22) Filed: Mar. 18, 2014

(65) Prior Publication Data

US 2014/0199426 A1  Jul. 17, 2014

Related U.S. Application Data

(62) Division of application No. 13/107,566, filed on May 13, 2011, now Pat. No. 8,728,377.

(30) Foreign Application Priority Data

Jun. 7, 2010  (KR) ........................ 10-2010-0053282

(51) Int. Cl.
  *B29C 59/02*  (2006.01)
  *B82Y 10/00*  (2011.01)
  (Continued)

(52) U.S. Cl.
  CPC ............... *B29C 59/026* (2013.01); *B82Y 10/00* (2013.01); *B82Y 40/00* (2013.01); *G03F 7/0002* (2013.01); *H01L 21/6838* (2013.01)

(58) Field of Classification Search
  CPC ..... B29C 59/026; G03F 7/001; G03F 7/0002; G03F 7/0027; B82Y 10/00
  USPC ............. 425/387.1, 388, 174.1; 264/494, 496
  See application file for complete search history.

(56) References Cited

U.S. PATENT DOCUMENTS

2005/0087911 A1  4/2005  Ford
2005/0184436 A1  8/2005  Jeong et al.
2007/0228589 A1*  10/2007  Choi et al. ..................... 264/39

FOREIGN PATENT DOCUMENTS

CN       101547748      9/2009
JP       2008-183810 A  8/2008
(Continued)

OTHER PUBLICATIONS

English abstract of KR2008046476, 2008.
(Continued)

*Primary Examiner* — Alison L Hindenlang
*Assistant Examiner* — Mohamed K Ahmed Ali
(74) *Attorney, Agent, or Firm* — Dentons US LLP

(57) ABSTRACT

Disclosed is an imprinting apparatus and imprinting method using the same that prevent a process of forming a pattern on a substrate from being affected by flatness of a stage. The imprinting apparatus comprises a chamber unit in which a process of forming a pattern on a substrate is carried out; a stage for supporting the substrate on which a resin layer is formed; an installing member positioned above the stage and having a mold member attached to transform the resin layer so as to form the pattern on the substrate; and a first spraying unit for spraying fluid to separate the substrate supported by the stage from the stage, wherein the installing member moves the mold member in the direction getting near to the substrate separated from the stage so that the mold member and the resin layer are brought into contact with each other.

12 Claims, 6 Drawing Sheets

(51) Int. Cl.
   *B82Y 40/00*   (2011.01)
   *G03F 7/00*    (2006.01)
   *H01L 21/683*  (2006.01)

(56)　　　　　References Cited

FOREIGN PATENT DOCUMENTS

| JP | 2008183810 | * | 8/2008 |
| JP | 2008-540164 | | 11/2008 |
| KR | 10-1999-0023935 | | 3/1999 |
| KR | 10-2006-0073764 | | 6/2006 |
| KR | 2008-0046476 A | | 5/2008 |
| TW | 200607576 | | 8/1994 |
| WO | 2006/011745 | | 11/2006 |

OTHER PUBLICATIONS

English abstract of JP2008183810, 2008.

* cited by examiner

IMPRINTING APPARATUS AND
IMPRINTING METHOD USING THE SAME

CROSS-REFERENCE TO RELATED
APPLICATIONS

This application is a divisional, and claims priority to, U.S. patent application Ser. No. 13/107,566 filed May 13, 2011, which claims priority to Korean Application No. 10-2010-0053282 filed Jun. 7, 2010, both of which is incorporated by reference for all purposes as if fully set forth herein.

BACKGROUND

1. Field of the Invention

The present invention relates to an imprinting apparatus for forming a pattern on a substrate used for a display device, and an imprinting method using the same.

2. Discussion of the Related Art

Display devices such as LCD (Liquid Crystal Display), OLED (Organic Light Emitting Diode), PDP (Plasma Display Panel), and EPD (Electrophoretic Display) are manufactured through several steps. For manufacturing these display devices, an imprinting process using an imprinting apparatus is carried out so as to form a pattern on a substrate used for the display devices.

The printing apparatus applies pressure to a substrate with a resin layer formed thereon through the use of mold member, to thereby transform the resin layer on the substrate in accordance with the shape of the mold member. Accordingly, a desired pattern is formed on the substrate. The mold member is embossed with the pattern desirous of being formed on the substrate.

The related art imprinting apparatus includes a stage for supporting the substrate. As the related art imprinting apparatus presses the mold member on the substrate supported by the stage, the pattern is imprinted on the substrate. In this respect, the related art imprinting apparatus may have a problem of blurs on the substrate with the pattern due to flatness of the stage. The blurs on the substrate may deteriorate picture quality of image displayed on the display device. Also, the related art imprinting apparatus uses the high-priced stage with good flatness to reduce the blurs occurring on the substrate, however, the high-priced stage causes the increase of manufacturing cost for the imprinting process, and furthermore causes the increase of unit cost for the substrate.

SUMMARY

Accordingly, the present invention is directed to an imprinting apparatus and an imprinting method using the same that substantially obviates one or more problems due to limitations and disadvantages of the related art.

An aspect of the present invention is to provide an imprinting apparatus and an imprinting method using the same, which facilitate to prevent a process of forming a pattern on a substrate from being influenced by flatness of a stage.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an imprinting apparatus comprising: a chamber unit in which a process of forming a pattern on a substrate is carried out; a stage for supporting the substrate on which a resin layer is formed, wherein the stage is installed in the chamber unit; an installing member to which a mold member is attached for transforming the resin layer so as to form the pattern on the substrate, wherein the installing member is installed in the chamber unit and positioned above the stage; and a first spraying unit for spraying fluid to separate the substrate supported by the stage from the stage, wherein the first spraying unit is installed in the chamber unit, wherein the installing member moves the mold member in the direction getting near to the substrate separated from the stage so that the mold member and the resin layer are brought into contact with each other.

In another aspect of the present invention, there is provided an imprinting method comprising: placing a substrate with a resin layer formed thereon on a stage installed in a chamber unit; bring a mold member into contact with the resin layer; and transforming the resin layer in accordance with the shape of the mold member, wherein the process of bring the mold member into contact with the resin layer comprises separating the substrate from the stage by spraying fluid toward the substrate supported by the stage.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, an imprinting apparatus according to the present invention will be described with reference to the accompanying drawings.

Figure 1:
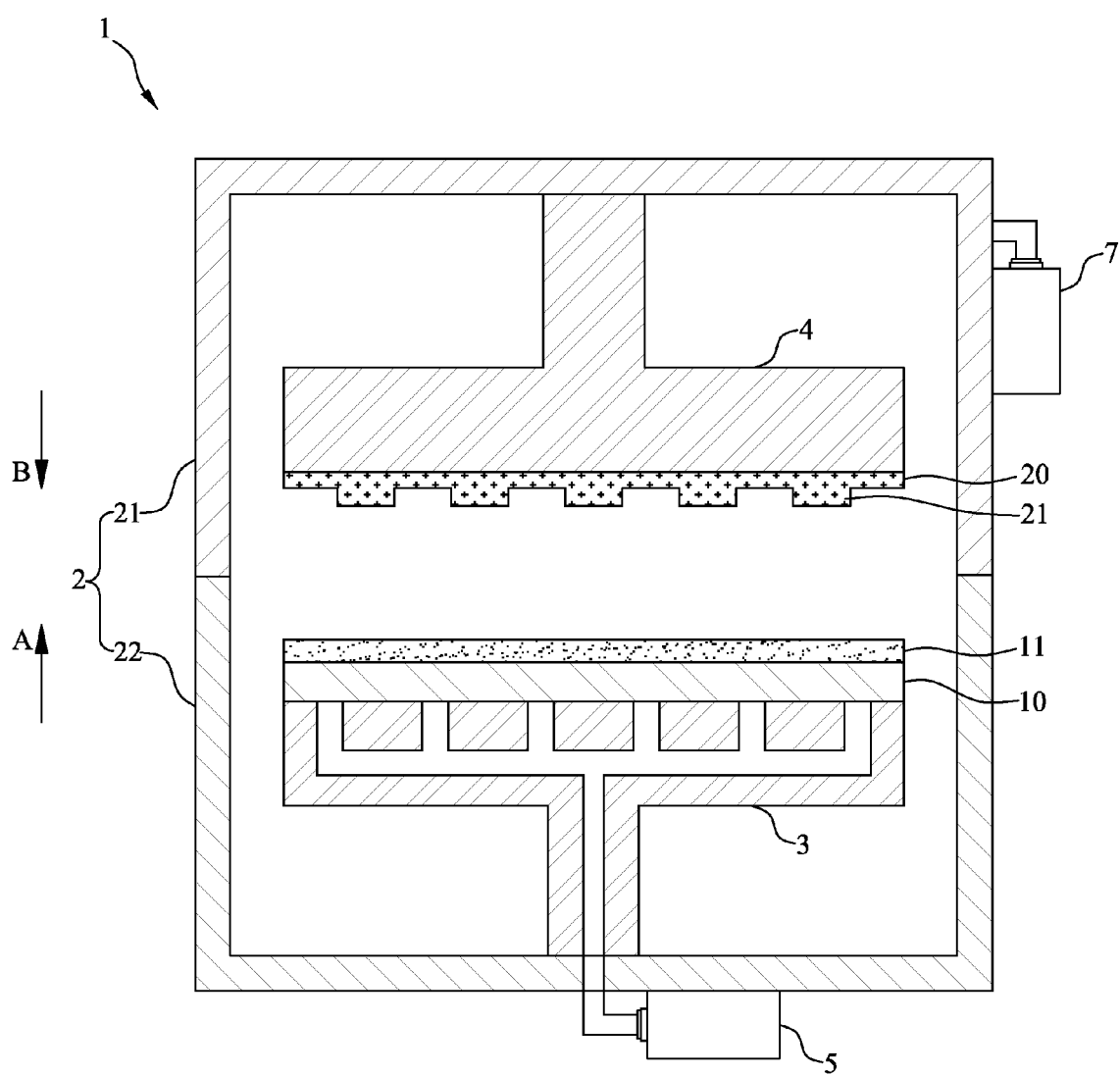
FIG. 1 is a cross section view illustrating an imprinting apparatus according to the present invention.
Figure 2:
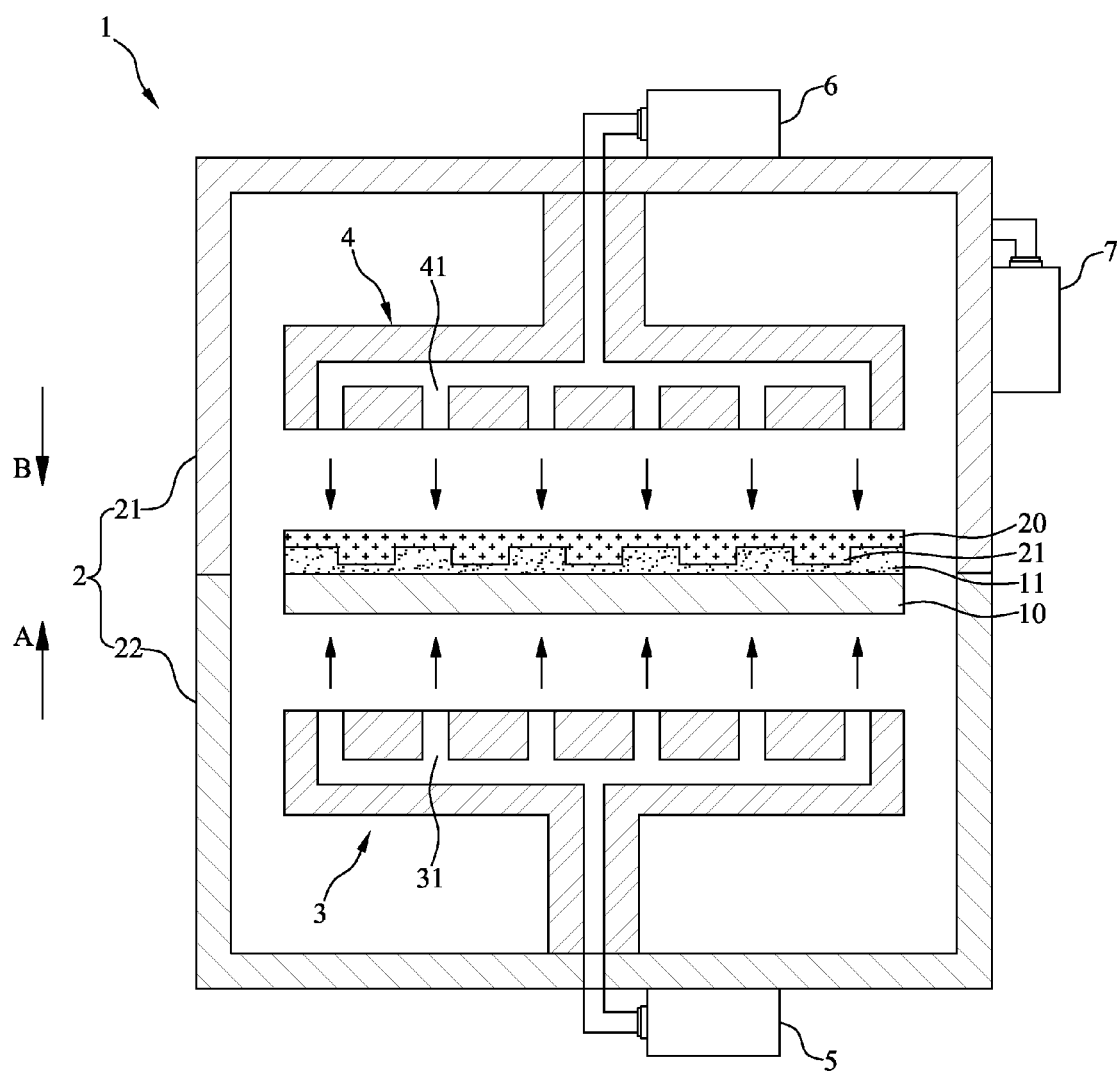
FIG. 2 is a cross section view illustrating an operational relationship in an imprinting apparatus according to the present invention.
Figure 3:
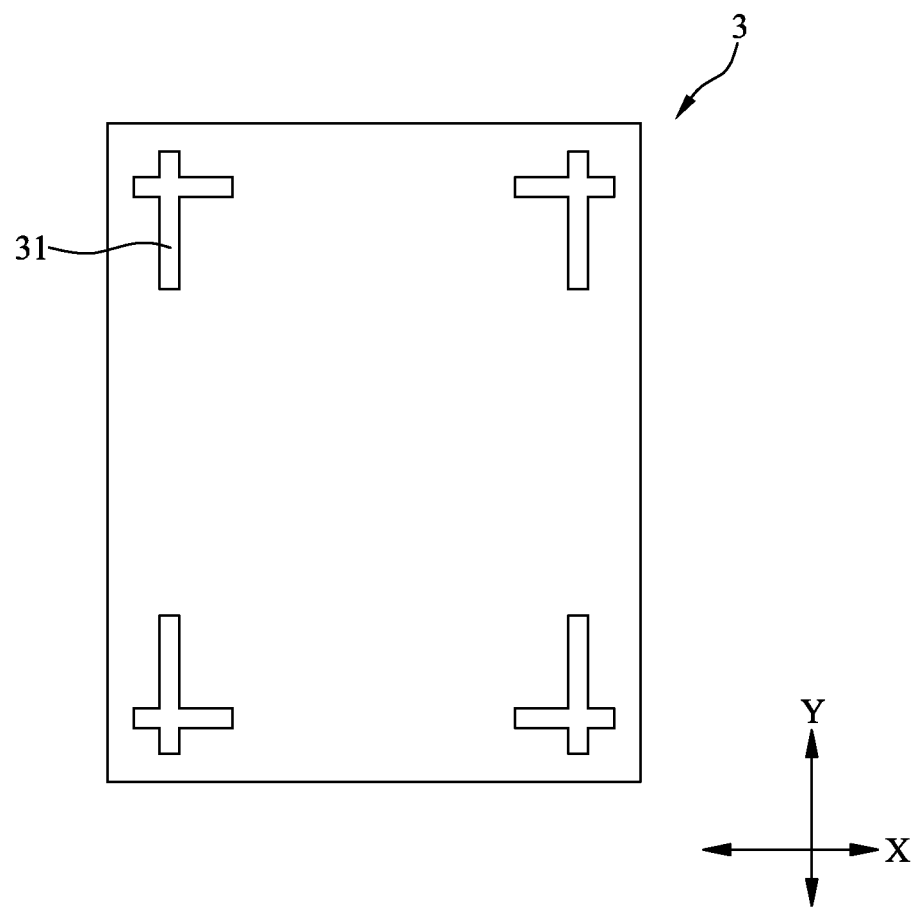
FIGS. 3 and 4 are plane views illustrating a stage according to the present invention.
Figure 4:
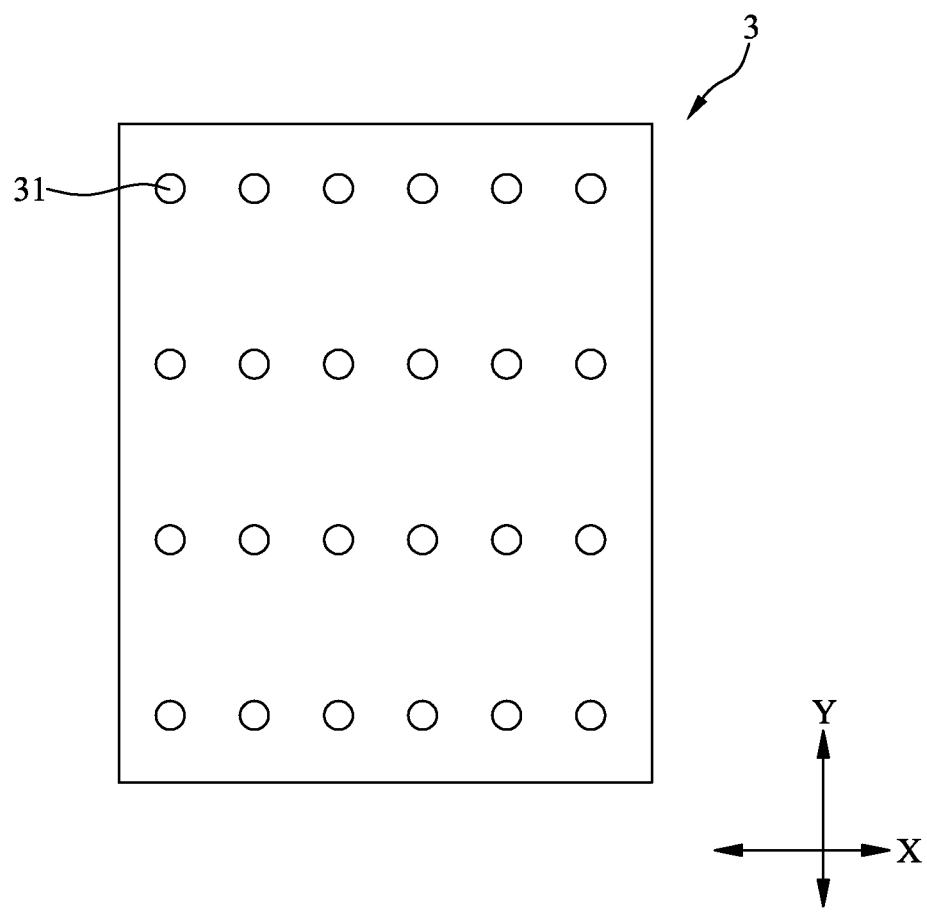
Figure 5:
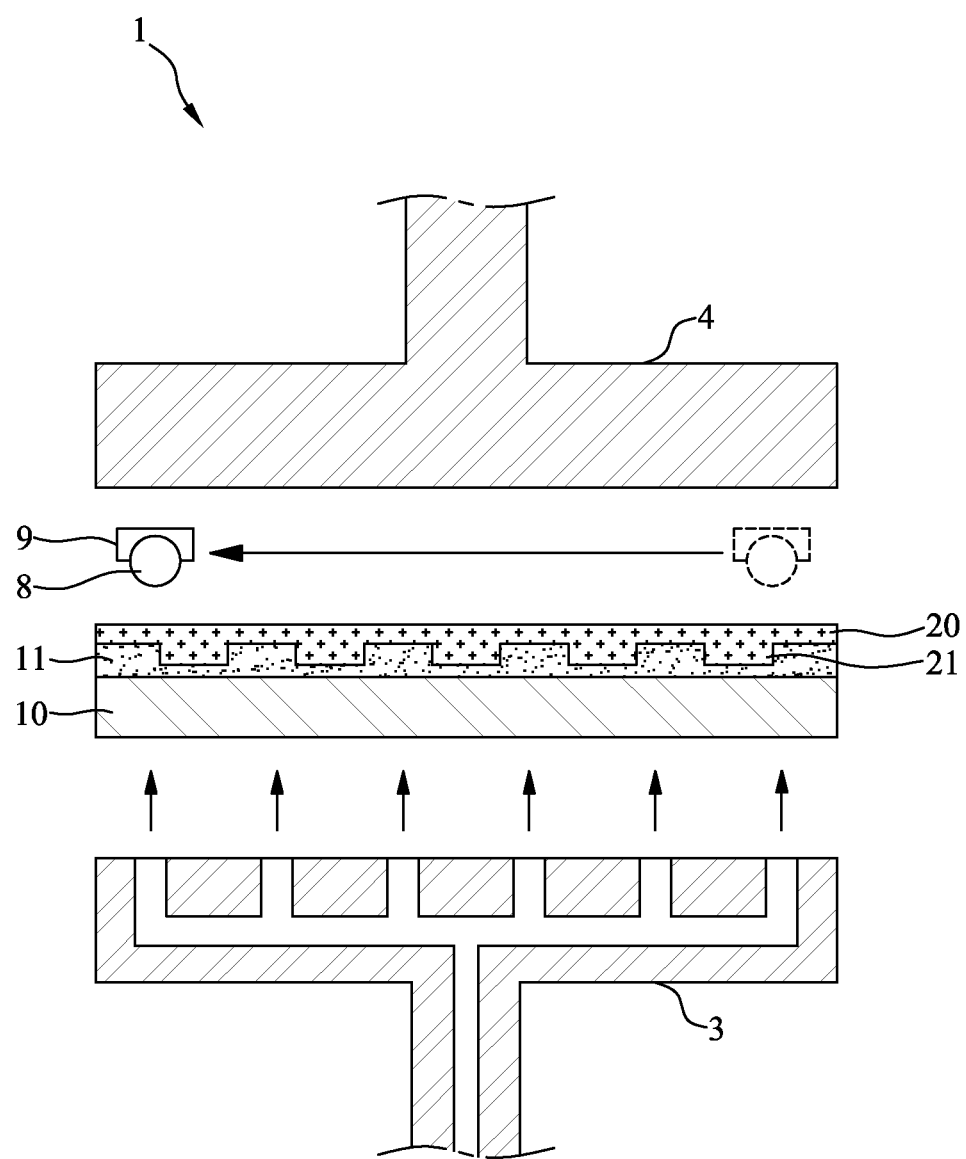
FIG. 5 is a cross section view illustrating an imprinting apparatus according to a modified embodiment of the present invention.

FIG. 1 is a cross section view illustrating an imprinting apparatus according to the present invention. FIG. 2 is a cross section view illustrating an operational relationship in an imprinting apparatus according to the present invention. FIGS. 3 and 4 are plane views illustrating a stage according to the present invention. FIG. 5 is a cross section view illustrating an imprinting apparatus according to a modified embodiment of the present invention.

Referring to FIG. 1, the imprinting apparatus 1 according to the present invention includes a chamber unit 2; a stage 3; an installing member 4; and a first spraying unit 5.

A process of forming a pattern on a substrate 10 is carried out in the chamber unit 2. The process of forming the pattern on the substrate 10 comprises forming a resin layer 11 on the substrate 10, and transforming the resin layer 11 in accordance with a shape of a mold member 20. The resin layer 11 may be formed by coating the substrate 10 with resin. The mold member 20 may include a projection member 21 whose shape corresponds to the aforementioned pattern. That is, the pattern desirous of being formed on the substrate 10 may be embossed on the mold member 20 through the use of projection member 21.

The chamber unit 2 may include a first chamber 21 and a second chamber 22. The first and second chambers 21 and 22 may be movably provided in such a manner that they are brought into contact with each other, or separated from each other. When the first and second chambers 21 and 22 are separated from each other, the substrate 10 with the resin layer 11 formed thereon may be loaded into the chamber unit 2, or unloaded from the chamber unit 2. When the first and second chambers 21 and 22 are in contact with each other, the process of forming the pattern on the substrate 10 may be carried out in the chamber unit 2. Although not shown, the chamber unit 2 may include an opening/shutting unit. Through the opening/shutting unit, the substrate 10 with the resin layer 11 formed thereon may be loaded into the chamber unit 2 or unloaded from the chamber unit 2. The substrate 10 may be loaded into or unloaded from the chamber unit 2 by an additional transferring unit (not shown).

Referring to FIGS. 1 and 2, the substrate 10 with the resin layer 11 formed thereon may be supported by the stage 3. The stage 3 may be installed to be positioned inside the chamber unit 2. As shown in FIG. 2, the substrate 10 may be moved toward an upper direction ('A' arrow direction) from the stage 3 by the first spraying unit 5. Thus, while floating above the stage, the substrate 10 may be separated by a predetermined space from the stage 3. Under the circumstances that the substrate 10 is separated by the predetermined space from the stage 3, the resin layer 11 may be transformed in accordance with the shape of the mold member 20.

Accordingly, the imprinting apparatus 1 according to the present invention prevents the process of forming the pattern on the substrate 10 from being influenced by flatness of the stage 3, to thereby reduce blurs on the substrate 10. Therefore, the imprinting apparatus 1 according to the present invention facilitates to improve picture quality of image displayed on a display device. Also, the imprinting apparatus 1 according to the present invention enables to manufacture the substrate 10 capable of realizing the improved picture quality without using the high-priced stage 3. Thus, the imprinting apparatus 1 according to the present invention facilitates to reduce a manufacturing cost in the process of forming the pattern on the substrate 10, and furthermore to reduce a unit cost of the substrate 10.

Referring to FIGS. 1 and 2, the stage 3 may include a first through-hole 31 connected with the first spraying unit 5. The first spraying unit 5 may spray fluid toward the substrate 10 through the first through-hole 31. Thus, according as the substrate 10 is moved toward the upper direction ('A' arrow direction), the substrate 10 may be separated by the predetermined space from the stage 3. The process of transforming the resin layer 11 in accordance with the shape of the mold member 20 may be carried out under the circumstances that the substrate 10 is separated by the predetermined space from the stage 3. The stage 3 may include the plural first through-holes 31.

As shown in FIG. 3, the first through-hole 31 may be formed in a cross shape obtained by crossing the through-hole extending in the X-axis direction and the through-hole extending in the Y-axis direction. The cross-shaped first through-holes 31 may be arranged along the edges of the stage 3, and more particularly at four corners of the stage 3. As shown in FIG. 4, the first through-hole 31 may be formed in a circle shape. The circle-shaped first through-holes 31 may be arranged at fixed intervals along the X-axis and Y-axis directions, to thereby make a matrix configuration. Although not shown, the first through-hole 31 may be formed in various shapes, for example, tetragon, oval, and etc., and the first through-hole 31 may be arranged in the central portion of the stage 3. That is, the first through-holes 31 may be provided in any shape and arrangement capable of passing the sprayed fluid therethrough so as to separate the substrate 10 from the stage 3 by the predetermined space.

Referring to FIGS. 1 and 2, the substrate 10 may be attached to the stage 3 by suction. For this, a first suction unit (not shown) for providing a sucking force may be connected with the stage 3. The first suction unit sucks the fluid through the first through-hole 31, to thereby attach the substrate 10 to the stage 3. Although not shown, a first suction hole may be formed in the stage 3; and the first suction unit may suck the fluid through the first suction hole, to thereby attach the substrate 10 to the stage 3. In this case, the first through-hole 31 and the first suction hole may be formed in the stage 3. The substrate 10 may be attached to the substrate 10 by static electricity. In this case, the stage 3 may be an electrostatic chuck (ESC). Under the circumstances that the substrate 10 is attached to the stage 3, the process of aligning the substrate 10 and the mold member 20 may be carried out. Herein, the substrate 10 and mold member 20 may be aligned by moving at least one of the stage 3 and the installing member 4.

Although not shown, the imprinting apparatus 1 according to the present invention may further comprise a first elevating unit. The first elevating unit may move up and down the stage 3. Thus, the substrate 10 supported by the stage 3 also may move up and down together with the movement of the stage 3. According as the first elevating unit moves up the stage 3, the substrate 10 may be moved to the direction getting near to the mold member 20 attached to the installing member 4. The first elevating unit may move up and down the stage 3 in a cylinder method using a hydraulic cylinder or a pneumatic cylinder; a gear method using a motor, a rack gear, and a pinion gear; a ball-screw method using a motor and a ball screw; or a belt method using a motor, a pulley, and a belt. In this case, the stage 3 may be movably installed in such a manner that the stage 3 may be moved up and down inside the chamber unit 2. Under the circumstances that the substrate 10 is moved to be near to the mold member 20, the process of aligning the substrate 10 and the mold member 20 may be carried out.

Referring to FIGS. 1 and 2, the mold member 20 may be attached to the installing member 4. The installing member 4 may be installed in the chamber unit 2 while being positioned above the stage 3. The mold member 20 attached to the installing member 4 may be positioned at a predetermined interval from the substrate 10 which is separated by the predetermined space from the stage 3.

By the use of suction, the mold member 20 may be attached to the installing member 4. For this, a second suction unit (not shown) for providing a sucking force may be connected with the installing member 4. Also, a second suction hole may be formed in the installing member; and the second suction unit may suck the fluid through the second suction hole, to thereby attach the mold member 20 to the installing member 4. The mold member 20 may be attached to the installing member 4 by static electricity. In this case, the installing member 4 may be an electrostatic chuck (ESC). Under the circumstances that the mold member 20 is attached to the installing member 4, the process of aligning the substrate 10 and the mold member 20 may be carried out. Herein, the substrate 10 and the mold member 20 may be aligned by moving at least one of the stage 3 and the installing member 4.

When the mold member 20 is separated from the installing member 4, the mold member 20 may be brought into contact with the resin layer 11. By stopping providing the sucking force for attaching the mold member 20 to the installing member 4, the mold member 20 may be separated by a predetermined space from the installing member 4. According as the installing member 4 stops the provision of electrostatic force to the mold member 20, the mold member 20 may be separated by the predetermined space from the installing member 4. The mold member 20 separated from the installing member 4 may be moved, due to its own weight, toward the direction ('B' arrow direction) getting near to the substrate 10 which is separated by the predetermined space from the stage 3, whereby the mold member 20 may be brought into contact with the resin layer 11.

Although not shown, the imprinting apparatus 1 according to the present invention may further comprise a second elevating unit. The second elevating unit may move up and down the installing member 4, whereby the mold member 20 attached to the installing member 4 also may move up and down. According as the second elevating unit moves down the installing member 4, the mold member 20 may be moved to the direction ('B' arrow direction) getting near to the substrate 10 which is separated by the predetermined space from the stage 3. The second elevating unit may move up and down the installing member 4 in a cylinder method using a hydraulic cylinder or a pneumatic cylinder; a gear method using a motor, a rack gear, and a pinion gear; a ball-screw method using a motor and a ball screw; or a belt method using a motor, a pulley and a belt. In this case, the installing member 4 may be movably installed in the chamber unit 2. Under the circumstances that the mold member 20 is moved to be near to the substrate 10, the process of aligning the substrate 10 and mold member 20 may be carried out.

Referring to FIGS. 1 and 2, the first spraying unit 5 may spray the fluid so that the substrate supported by the stage 3 is separated by the predetermined space from the stage 3. Owing to the fluid sprayed from the first spraying unit 5, the substrate 10 may be moved toward the upper direction ('A' arrow direction). Thus, the substrate 10 may be separated by the predetermined space from the stage 3. Under the circumstances that the substrate 10 is separated by the predetermined space from the stage, the resin layer 11 may be transformed in accordance with the shape of the mold member 20. Accordingly, the imprinting apparatus 1 according to the present invention facilitates to prevent the process of forming the pattern on the substrate 10 from being influenced by flatness of the stage 3, to thereby reduce blurs on the substrate 10. The first spraying unit 5 may be installed in the chamber unit 2. The first spraying unit 5 may be installed inside the chamber unit 2, or outside the chamber unit 2.

The first spraying unit 5 may be installed while being connected with the first through-hole 31. The fluid sprayed from the first spraying unit 5 may be moved through the first through-hole 31, and may be sprayed toward the substrate 10 supported by the stage 3. Accordingly, the substrate 10 supported by the stage 3 may be separated by the predetermined space from the stage 3. If the stage 3 includes the plural first through-holes 31, the plural first through-holes 31 may be connected to be in communication with one another, and at least one of the plural first through-holes 31 may be connected with the first spraying unit 5. Although not shown, the imprinting apparatus 1 according to the present invention may include the plural first spraying units 5 whose number correspond to the number of the first through-holes 31. The first spraying unit 5 may spray the fluid such as nitrogen or air.

Referring to FIGS. 1 and 2, the imprinting apparatus 1 according to the present invention may further comprise a second spraying unit 6.

The second spraying unit 6 may spray the fluid so that the mold member 20 attached to the installing member 4 is separated by the predetermined space from the installing member. The fluid sprayed from the second spraying unit 6 makes the mold member 20 separated by the predetermined space from the installing member 4. The mold member 20 separated by the predetermined space from the installing member 4 may be moved due to its own weight toward the direction ('B' arrow direction) getting near to the substrate 10 which is separated by the predetermined space from the stage 3. Under the circumstances that the substrate 10 is separated by the predetermined space from the stage 3, the mold member 20 may be brought into contact with the resin layer 11. The second spraying unit 6 may be installed in the chamber unit 2. The second spraying unit 6 may be installed inside the chamber unit 2, or outside the chamber unit 2.

The second spraying unit 6 may be installed while being connected with a second through-hole 41 in the installing member 4. Fluid sprayed from the second spraying unit 6 may be moved through the second through-hole 41, and may be sprayed toward the mold member 20 attached to the installing member 4 through the second through-hole 41. Thus, the mold member 20 may be separated by the predetermined space from the installing member 20, and may be moved toward the direction ('B' arrow direction) getting near to the substrate 10 which is separated by the predetermined space from the stage 3. The installing member 4 may include the plural second through-holes 41. In this case, the plural second through-holes 41 may be connected to be in communication with one another, and at least one of the plural first through-holes 41 may be connected with the second spraying unit 6. Although not shown, the imprinting apparatus 1 according to the present invention may include the plural second spraying units 6 whose number corresponds to the number of the second through-holes 41. The second spraying unit 6 may spray the fluid such as nitrogen or air. The second spraying unit 6 may be connected with the second suction hole, and may spray the fluid for separating the mold member 20 from the installing member 4 through the second suction hole.

Referring to FIGS. 1 and 2, the imprinting apparatus 1 according to the present invention may further comprise a pressure adjusting unit 7.

The pressure adjusting unit 7 adjusts the pressure inside the chamber unit 2. The pressure adjusting unit 7 sucks the fluid inside the chamber unit 2, or sprays the fluid into the chamber unit 2, to thereby adjust the pressure inside the chamber unit 2. The pressure adjusting unit 7 may be installed in the chamber unit 2.

The pressure adjusting unit 7 may adjust the internal pressure of the chamber unit 2 to a first pressure. The first pressure may be a vacuum or close to the vacuum. As the internal pressure of the chamber unit 2 is adjusted to the first pressure by the pressure adjusting unit 7, it is possible to prevent foams from being produced in the resin layer 11 during the process of contacting the mold member 20 with the resin layer 11. Thus, the imprinting apparatus 1 according to the present invention is capable of imprinting the high-quality pattern on the substrate 10, to thereby manufacture the high-quality substrate 10.

Under control of the pressure adjusting unit 7, the internal pressure of the chamber unit 2 is adjusted from the first pressure to a second pressure. The second pressure is higher than the first pressure. The second pressure may be an atmospheric pressure, or close to the atmospheric pressure. According as the internal pressure of the chamber unit 2 is adjusted from the first pressure to the second pressure by the pressure adjusting unit 7, the pressure difference makes the resin layer 11 transformed in accordance with the shape of the mold member 20. This will be described as follows.

First, the substrate 10 is placed on the stage 3, and then the mold member 20 is attached to the installing member 4. Under these circumstances, the pressure adjusting unit 7 adjusts the internal pressure of the chamber unit 2 to the first pressure. Following the movement of at least one of the stage 3 and the installing member 4, the substrate 10 and the mold member 20 may be aligned.

Next, the substrate 10 is separated by the predetermined space from the stage 3 owing to the fluid sprayed from the first spraying unit 5. Then, the mold member 20 is separated by the predetermined space from the installing member 4, whereby the mold member 20 is brought into contact with the resin layer 11. The process of separating the substrate 10 from the stage 3 by the predetermined space is almost simultaneous with the process of separating the mold member 20 from the installing member 4 by the predetermined space.

Then, the pressure adjusting unit 7 adjusts the internal pressure of the chamber unit 2 to the second pressure from the first pressure. Thus, the pressure in a contact surface between the mold member 20 and the resin layer 11 roughly corresponds to the first pressure, and the pressure outside the mold member 20 and the substrate 10 corresponds to the second pressure. Accordingly, the mold member 20 and the substrate 10 may be moved in the direction approaching toward each other due to the pressure difference therebetween, whereby the resin layer 11 may be transformed in accordance with the shape of the mold member 20.

The imprinting apparatus 1 according to the present invention facilitates to transform the resin layer 11 in accordance with the shape of the mold member 20 under the circumstances that the substrate 10 is separated by the predetermined space from the stage 3. Thus, the imprinting apparatus 1 according to the present invention prevents the process of forming the pattern on the substrate 10 from being influenced by flatness of the stage 3, to thereby reduce blurs on the substrate 10. The second pressure adjusted inside the chamber unit 2 may be obtained when the first spraying unit 5 sprays the fluid to separate the substrate 10 from the stage 3 by the predetermined space; when both the first spraying unit 5 and the second spraying unit 6 spray the fluid; or when the first and second chambers 11 and 12 are separated by the predetermined space from each other, or the opening/shutting unit is opened.

Referring to FIG. 5, the imprinting apparatus 1 according to the present invention may further comprise an illuminating unit 8.

The illuminating unit 8 may emit light to cure the resin layer 11. The illuminating unit 8 emits light to the resin layer 11 whose shape has been transformed in accordance with the mold member 20. That is, as the light emitted from the illuminating unit 8 is applied to the transformed resin layer 11, the resin layer 11 may be cured while being maintained in the shape transformed in accordance with the shape of the mold member 20. The illuminating unit 8 may emit light toward the substrate 10 separated by the predetermined space from the stage 3. That is, while the illuminating unit 8 emits light to the resin layer 11, the substrate 10 may be separated by the predetermined space from the stage 3. Thus, the imprinting apparatus 1 according to the present invention prevents the process of forming the pattern on the substrate 10 from being influenced by flatness of the stage 3, to thereby reduce blurs on the substrate 10. The illuminating unit 8 may be a UV lamp which emits UV rays; and the resin layer 11 may be formed of resin which is cured by UV rays. The illuminating unit 8 may be installed inside the chamber unit 2.

Referring to FIG. 5, the imprinting apparatus 1 according to the present invention may further comprise a transferring unit 9.

The transferring unit 9 may transfer the illuminating unit 8. According as the transferring unit 9 transfers the illuminating unit 8, the light emitted from the illuminating unit 8 is applied throughout an entire surface of the resin layer 11. The illuminating unit 8 may be installed movably between the inside and outside of the chamber unit 2. In this case, when the resin layer 11 is transformed in accordance with the shape of the mold member 20, the transferring unit 9 transfers the illuminating unit 8 to the inside of the chamber unit 20, and moves the illuminating unit 8 so as to apply the light emitted from the illuminating unit 8 to the entire surface of the resin layer 11. When the resin layer 11 is cured, the transferring unit 9 transfers the illuminating unit 8 to the outside of the chamber unit 2. The transferring unit 9 may transfer the illuminating unit 8 in a cylinder method using a hydraulic cylinder or a pneumatic cylinder; a gear method using a motor, a rack gear, and a pinion gear; a ball-screw method using a motor and a ball screw; or a belt method using a motor, a pulley and a belt.

Hereinafter, an imprinting method according to the embodiment of the present invention will be described with the accompanying drawings.

Figure 6:
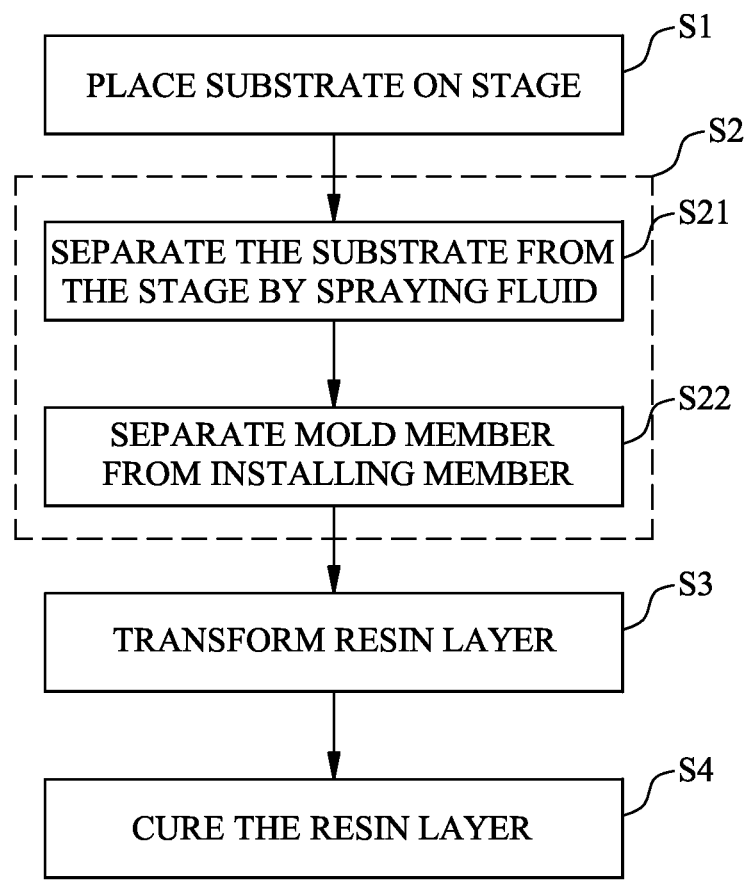
FIG. 6 is a flowchart of an imprinting method according to the present invention.

FIG. 6 is a flowchart illustrating an imprinting method according to the present invention.

Referring to FIGS. 1 to 6, the imprinting method according to the present invention may include the following processes.

First, the substrate 10 with the resin layer 11 formed thereon is placed on the stage 3 (S1). This process (S1) comprises loading the substrate 10 into the chamber unit 2, and placing the loaded substrate 10 on the stage 3. In this case, the first and second chambers 11 and 12 are maintained while being separated from each other or the opening/shuttering member (not shown) is opened so that the substrate 10 is capable of being loaded into the chamber unit 2. The substrate 10 may be attached to the stage 3 while being placed on the stage 3. Under this circumstance, the pressure adjusting unit 7 adjusts the internal pressure of the chamber unit 2 to the first pressure.

The above process (S1) may further comprise steps of moving the substrate 10 supported by the stage 3 and the mold member 4 attached to the installing member 4 so as to make them nearer to each other; and aligning the substrate 10 and the mold member 20. The step of moving the substrate 10 supported by the stage 3 and the mold member 4 attached to the installing member 4 so as to make them nearer to each other comprises moving up the stage 3 by the first elevating unit; and moving down the installing member 4 by the second elevating unit. Under the circumstances that the substrate 10 and the mold member 20 are positioned near to each other, the substrate 10 and the mold member 20 may be aligned by moving at least one of the stage 3 and the installing member 4.

Then, the mold member 20 is bought into contact with the resin layer 11 (S2). This process (S2) comprises the sub-process (S21) of spraying the fluid toward the substrate 10 supported by the stage so as to separate the substrate 10 from the stage 3. The sub-process (S21) may be accomplished by spraying the fluid through the use of first spraying unit 5. Owing to the fluid sprayed from the first spraying unit 5, the substrate 10 is moved toward the upper direction ('A' arrow direction), and then separated by the predetermined space from the stage 3. This enables to accomplish the process of forming the pattern on the substrate 10 separated by the predetermined space from the stage 3.

Then, the resin layer 11 being in contact with the mold member 20 is transformed in accordance with the shape of the mold member 20 (S3). This process (S3) may be carried out under the circumstances that the substrate 10 is separated by the predetermined space from the stage 3. Thus, the imprinting method according to the present invention prevents the process of forming the pattern on the substrate 10 from being influenced by flatness of the stage 3, to thereby reduce blurs on the substrate 10.

At this time, the process (S2) of bringing the mold member 20 into contact with the resin layer 11 may comprise the sub-process (S22) of separating the mold member 20 from the installing member 4. Through the above sub-process (S22), the mold member 20 may be moved, due to its own weight, toward the direction ('B' arrow direction) getting near to the substrate 10 separated by the predetermined space from the stage 3, whereby the mold member 20 is brought into contact with the resin layer 11. The sub-process (S22) of separating the mold member 20 from the installing member 4 by the predetermined space is almost simultaneously with the process (S21) of separating the substrate 10 from the stage 3 by the predetermined space. The sub-process (S22) of separating the mold member 20 from the installing member 4 may be accomplished by spraying the fluid toward the mold member 20 attached to the installing member 4. This may be accomplished when the second spraying unit 6 sprays the fluid toward the mold member 20 attached to the installing member 4. The sub-process (S22) of separating the mold member 20 from the installing member 4 may be accomplished by stopping provision of the sucking force or electrostatic force applied to attach the mold member 20 to the installing member 4.

The process (S3) of transforming the resin layer 11 may comprise adjusting the internal pressure of the chamber unit 2 from the first pressure to the second pressure when the mold member 20 is brought into contact with the resin layer 11. When the internal pressure of the chamber unit 2 is adjusted to the second pressure, the mold member 20 and the substrate 10 may be moved in the direction approaching toward each other due to the pressure difference therebetween, whereby the resin layer 11 may be transformed in accordance with the shape of the mold member 20. The process of adjusting the internal pressure of the chamber unit 2 from the first pressure to the second pressure may be accomplished by the pressure adjusting unit 7; by the fluid sprayed from the first spraying unit 5; by the fluid sprayed from the first and second spraying units 5 and 6; or by separating the first and second chambers 11 and 12 from each other, or opening the opening/shutting unit.

Referring to FIGS. 1 to 6, the imprinting method according to the present invention may further comprise the process (S4) of curing the resin layer 11 whose shape is transformed in accordance with the mold member 20. This process (S4) may be accomplished by applying the light emitted from the illuminating unit 8 to the resin layer 11. As the light emitted from the illuminating unit 8 is applied throughout the entire surface of the resin layer 11, the resin layer 11 whose shape is transformed in accordance with the mold member 20 may be cured.

The process (S4) of curing the resin layer 11 may comprise the process of applying the light emitted from the illuminating unit 8 toward the substrate 10 separated by the predetermined space from the stage 3 so as to cure the resin layer 11. That is, while the illuminating unit 8 emits the light to the resin layer 11, the substrate 10 may be separated by the predetermined space from the stage 3. Thus, the imprinting apparatus 1 according to the present invention prevents the process of forming the pattern on the substrate 10 from being influenced by flatness of the stage 3, to thereby reduce blurs on the substrate 10.

The process (S4) of curing the resin layer 11 may comprise the process of moving the illuminating unit 8 so as to apply the light emitted from the illuminating unit 8 throughout the entire surface of the resin layer 11. This process (S4) may be accomplished by moving the illuminating unit 8 through the use of transferring unit 9.

Accordingly, the imprinting apparatus according to the present invention and the imprinting method using the same can prevent the process of forming the pattern on the substrate 10 from being influenced by flatness of the stage 3, to thereby reduce blurs on the substrate 10. Owing to the reduction in the blurs, it is possible to improve the picture quality of the image to be displayed on the display device.

Even though the high-priced stage 3 with good flatness is not used for the imprinting apparatus and method according to the present invention, it is possible to manufacture the substrate 10 enabling the good picture quality, and furthermore to reduce the manufacturing cost for the process of forming the pattern, and to lower the unit cost for the substrate 10.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An imprinting apparatus comprising:
   a chamber unit in which a process of forming a pattern on a substrate is carried out;
   a stage configured to provide initial support of the substrate having a resin layer directly thereon, wherein the stage is installed in the chamber unit;
   an installing member having a mold member initially attached thereon, wherein the installing member is located in the chamber unit and positioned above the stage; and
   a first spraying unit configured to spray fluid that completely separates the substrate with the resin layer from the stage in a direction of the mold member and away from the stage, wherein the first spraying unit is installed in the chamber unit,
   wherein the mold member is configured to physically contact the completely separated substrate with the resin layer thereon,
   wherein a pattern on the resin layer on the separated substrate is the same as a pattern of the contacted mold member, wherein the stage comprises plural first through-holes connected with the first spraying unit, wherein the plural first through-holes are arranged along edges of the stage and pass the sprayed fluid from the first spraying unit to uniformly separate a whole surface of the substrate a predetermined distance from the stage, and wherein the first spraying unit sprays the fluid to completely separate the whole surface of the substrate the predetermined distance from the stage through the first through-holes.

2. The imprinting apparatus according to claim 1, further comprising:

an illuminating unit for emitting light to cure the resin layer; and a transferring unit for transferring the illuminating unit so as to apply the light emitted from the illuminating unit throughout an entire surface of the resin layer, wherein the illuminating unit emits the light toward the substrate spaced from the stage so as to cure the resin layer whose shape is transformed in accordance with the mold member.

3. The imprinting apparatus according to claim 1, further comprising a second spraying unit for spraying fluid to separate the mold member from the installing member, the second spraying unit installed in the chamber unit, wherein the installing member includes a second through-hole connected with the second spraying unit, and wherein the second spraying unit is connected with the second through-hole for spraying the fluid to separate the mold member from the installing member through the second through-hole.

4. The imprinting apparatus according to claim 1, further comprising a pressure adjusting unit for adjusting an internal pressure of the chamber unit, wherein the pressure adjusting unit adjusts the internal pressure of the chamber unit from a first pressure to a second pressure so as to transform the resin layer being in contact with the mold member in accordance with the shape of the mold member, wherein the second pressure is higher than the first pressure.

5. The imprinting apparatus according to claim 1, wherein the first through-holes are arranged in a cross shape respectively.

6. The imprinting apparatus according to claim 1, wherein the first through-holes are arranged at four corners of the stage.

7. The imprinting apparatus according to claim 1, wherein the first through-holes are formed in a circle shape.

8. The imprinting apparatus according to claim 1, wherein the first through-holes are arranged at fixed intervals as a matrix configuration.

9. The imprinting apparatus according to claim 1, wherein the stage further comprise the first through-holes arranged in the central portion of the stage.

10. The imprinting apparatus according to claim 3, wherein the installing member includes the plural second through-holes connected with the second spraying unit, wherein the plural second through-holes passes the sprayed fluid from the second spraying unit to separate the whole surface of the mold member from the installing member.

11. The imprinting apparatus according to claim 1, further comprising a pressure adjusting unit for adjusting the internal pressure of the chamber unit to a first pressure, wherein the first spraying unit sprays the fluid into the chamber unit through the first through-holes for adjusting an internal pressure of the chamber unit from the first pressure to a second pressure, wherein the second pressure is higher than the first pressure.

12. The imprinting apparatus according to claim 3, further comprising a pressure adjusting unit for adjusting an internal pressure of the chamber unit to a first pressure, wherein the first spraying unit and second spraying unit spray the fluid into the chamber unit through the first through-holes and second through-holes respectively for adjusting the internal pressure of the chamber unit from the first pressure to a second pressure, wherein the second pressure is higher than the first pressure.

* * * * *